(12) United States Patent
Audibert et al.

(10) Patent No.: US 6,772,887 B2
(45) Date of Patent: Aug. 10, 2004

(54) RACK MOUNTABLE FIBER SPLICE AND PATCH ENCLOSURE

(75) Inventors: Kevin Joseph Audibert, Wolcott, CT (US); Steven O. Fournier, Southington, CT (US); Kevin J. Stronkowsky, Middlebury, CT (US); Feliks Rabinovich, Cheshire, CT (US)

(73) Assignee: The Siemon Company, Watertown, CT (US)

(*) Notice: Subject to any disclaimer, the term of this patent is extended or adjusted under 35 U.S.C. 154(b) by 0 days.

(21) Appl. No.: 10/024,104

(22) Filed: Dec. 17, 2001

(65) Prior Publication Data

US 2002/0117942 A1 Aug. 29, 2002

Related U.S. Application Data

(60) Provisional application No. 60/268,979, filed on Feb. 15, 2001, and provisional application No. 60/256,769, filed on Dec. 19, 2000.

(51) Int. Cl.⁷ ................................................. A47F 5/00
(52) U.S. Cl. ..................................... 211/26; 312/223.2
(58) Field of Search ........................... 312/223.1, 223.6; 211/26

(56) References Cited

U.S. PATENT DOCUMENTS

| | | | |
|---|---|---|---|
| 3,295,905 A | * 1/1967 | Sisk et al. | 312/273 |
| 4,353,518 A | * 10/1982 | Taylor et al. | 248/60 |
| 5,066,149 A | 11/1991 | Wheeler et al. | 385/135 |
| 5,339,379 A | 8/1994 | Kutsch et al. | 385/135 |
| 5,443,312 A | * 8/1995 | Schluter | 312/334.27 |
| 6,070,742 A | * 6/2000 | McAnally et al. | 211/26 |
| 6,142,590 A | * 11/2000 | Harwell | 312/223.1 |
| 6,305,556 B1 | * 10/2001 | Mayer | 211/26 |

* cited by examiner

*Primary Examiner*—Lanna Mai
(74) *Attorney, Agent, or Firm*—Cantor Colburn LLP

(57) ABSTRACT

A cable management enclosure includes: a side; a sliding drawer; a fiber slack manager mounted to the side, the fiber slack manager includes: a first link having a first end and a second end, the first end pivotally secured to the side; and a second link pivotally coupled to the second end of the first link, the second link pivotally secured to the sliding drawer. A cable management enclosure also includes: a main body portion having a first side and a second side; a sliding drawer disposed between the first side and the second side; a patch panel disposed between the first side and the second side, the patch panel having a plurality of openings, the patch panel is mounted to the sliding drawer; wherein the sliding drawer includes a front portion and a rear portion, the first portion slides relative to the rear portion, the front portion and the rear portion slide relative to the first side, the front portion is smaller than the rear portion.

12 Claims, 24 Drawing Sheets

1

RACK MOUNTABLE FIBER SPLICE AND PATCH ENCLOSURE

CROSS-REFERENCE TO RELATED APPLICATION

The present application claims the benefit of the date of the earlier filed provisional applications, having U.S. Provisional Application No. 60/256,769, filed on Dec. 19, 2000 and U.S. Provisional Application No. 60/268,979, filed on Feb. 15, 2001, which are incorporated herein in their entirety.

BACKGROUND OF THE INVENTION

The invention relates generally to enclosures for cabling systems and in particular to a rack mountable enclosure that provides fiber splicing and/or patching capability. Cable management enclosures are used to terminate and distribute cable for a variety of applications. One existing type of cable management enclosure is a fiber management enclosure often employed to provide for managing optical fiber. When the optical fiber is located in the enclosure, it is desirable to manage and control the optical fiber within the enclosure so that a bend radius of the optical fiber is above a certain threshold. When the bend radius is too small and the optical fiber is tightly bent, the optical fiber may crack and become less efficient during operation.

SUMMARY OF THE INVENTION

An exemplary embodiment of the invention is a cable management enclosure that provides for fiber splicing. The enclosure includes at least one sliding drawer to provide access to a splice tray and a fiber slack manager to manage lengths of fiber when the drawer is opened and closed.

Another embodiment of the invention is a cable management enclosure that provides for fiber splicing and patching. The enclosure includes a sliding drawer to provide access to a splice tray and a patch panel. A fiber slack manager manages lengths of fiber when the drawer is opened and closed.

BRIEF DESCRIPTION OF THE DRAWINGS

Referring now to the drawings wherein like elements are numbered alike in the several FIGURES.

DETAILED DESCRIPTION

Figure 1:
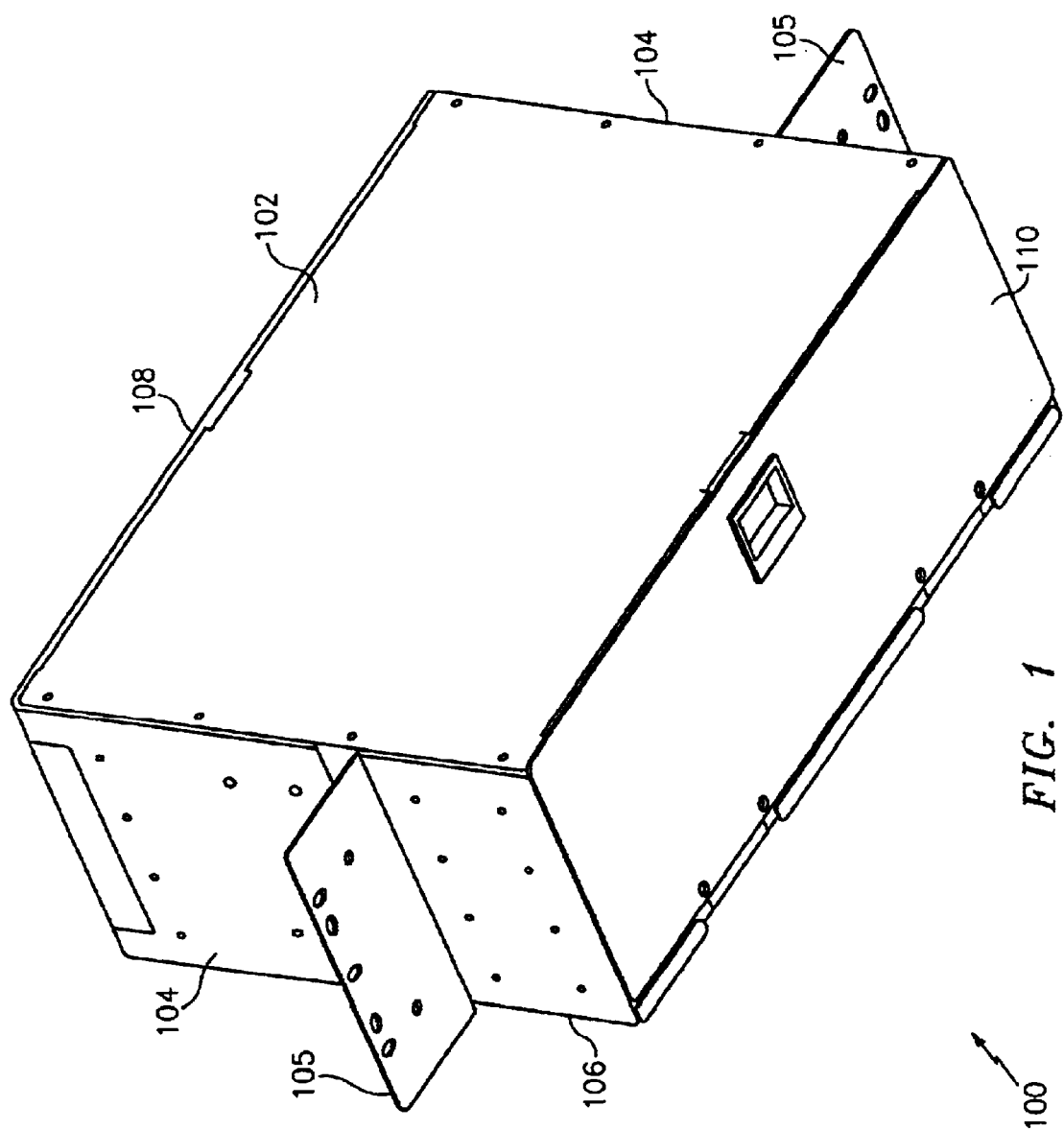
FIGS. 1–8 are various views of a cable management enclosure that provides for fiber splicing.
Figure 2:
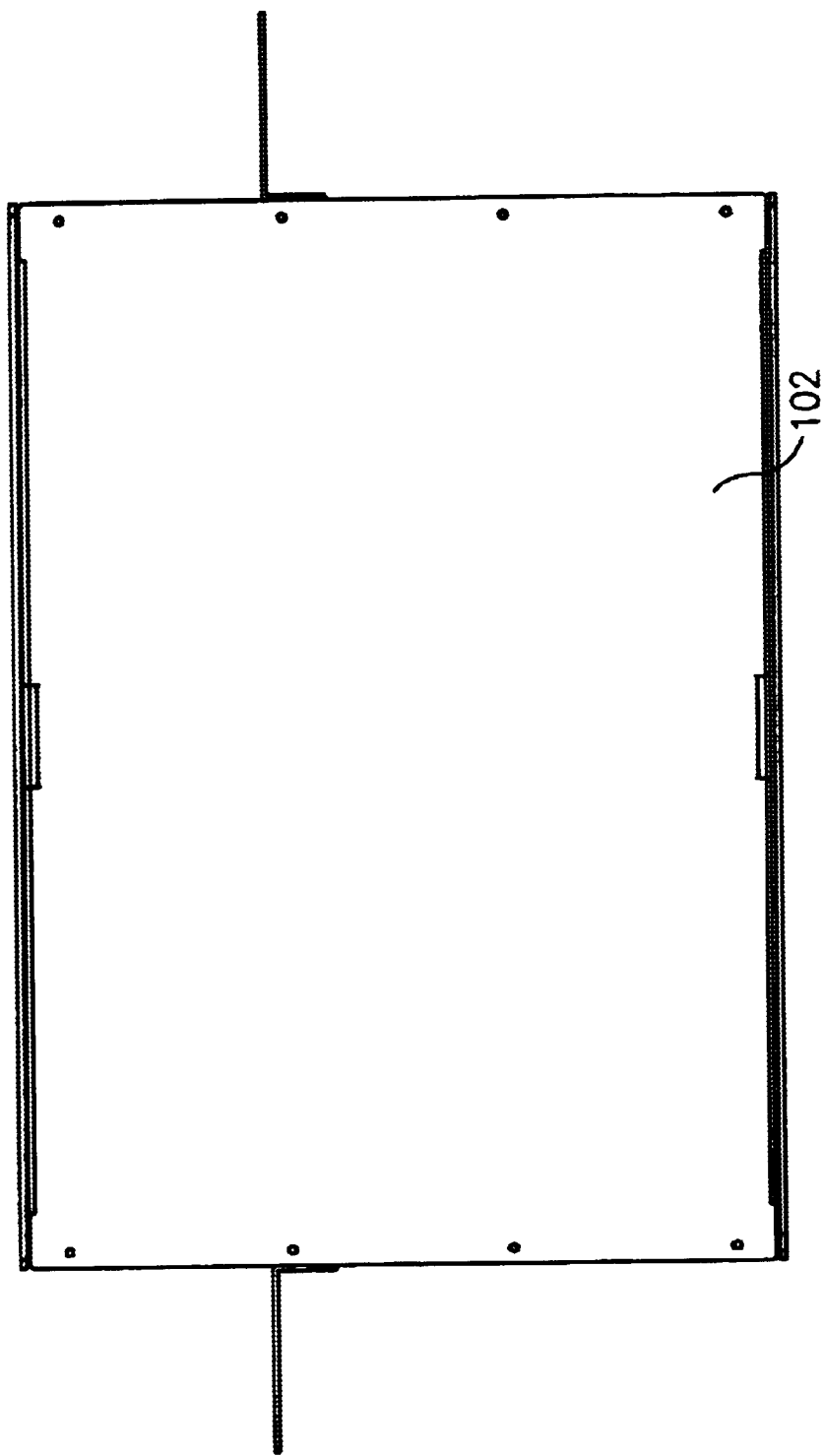
Figure 3:
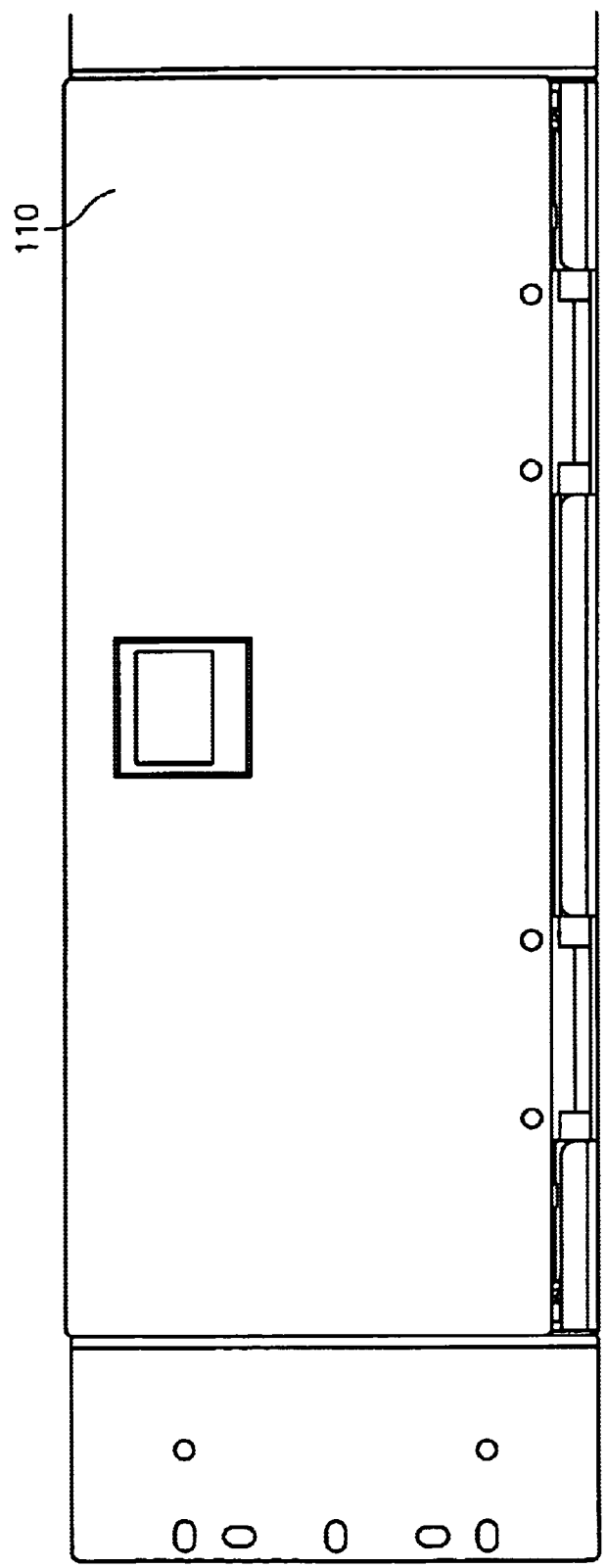

FIG. 1 is a perspective view of a cable management enclosure 100 in an embodiment of the invention. The cable management enclosure 100 includes six sides, which include a top 102, sides 104, bottom 106, rear 108 and front door 110. The front door 110 is hinged at bottom 106 to provide access to the interior of the cable management enclosure 100. The distance between sides 104 is set so that the cable management enclosure 100 can be mounted in standard telecommunications racks. Brackets 105 may be used to mount the cable management enclosure 100 to racks having various widths. FIG. 2 is a top view and FIG. 3 is a front view of the cable management enclosure 100. The rear 108 may be open and a hinged rear door may be used to provide access to the cable management enclosure 100.

Figure 4:
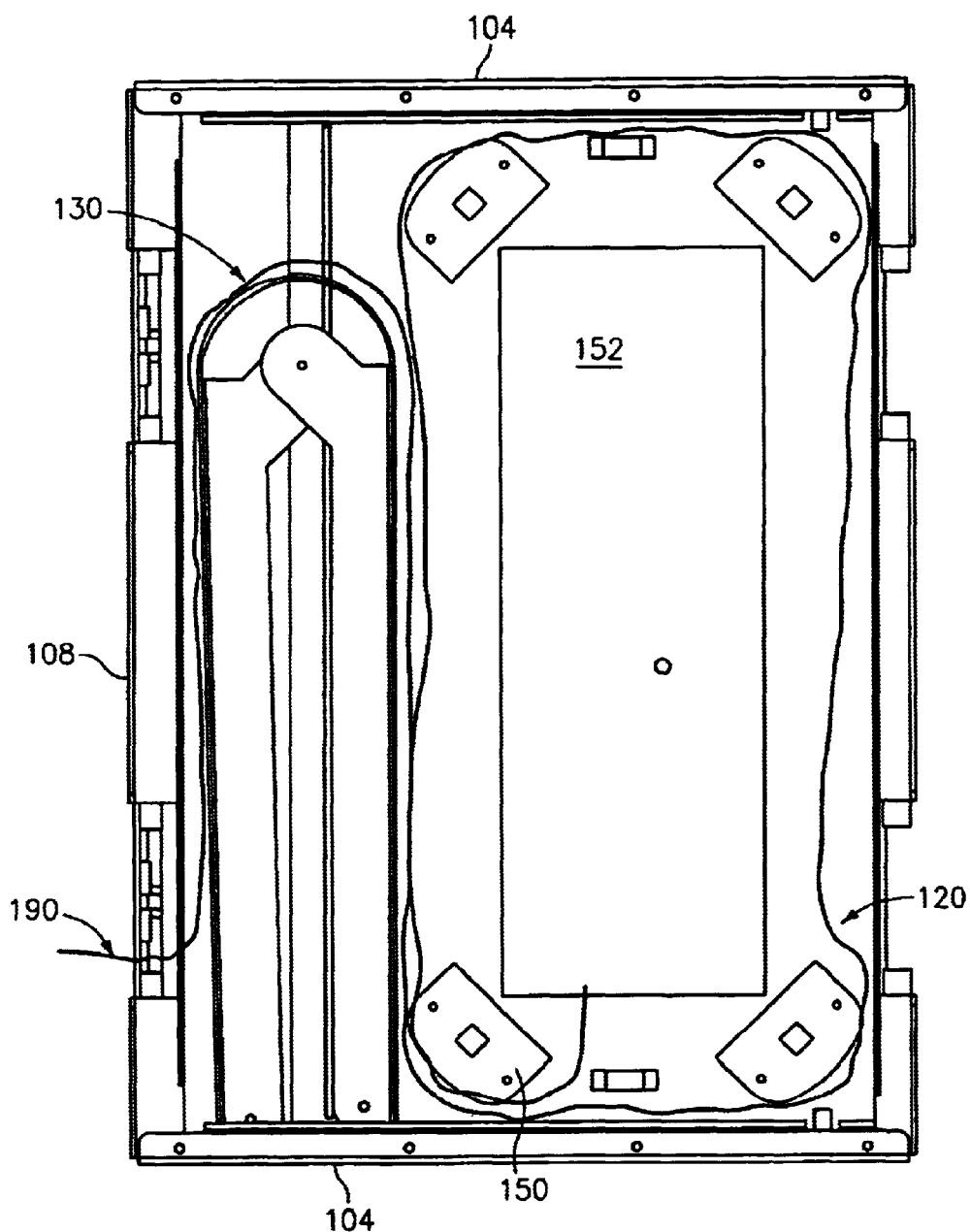

FIG. 4 is a top view of the cable management enclosure 100 with top 102 removed. The cable management enclosure 100 includes a sliding drawer 120 and a fiber slack manager 130. As shown in FIG. 4, the sliding drawer 120 is in a closed position. Fiber 190 is lead in near the rear 108 of the cable management enclosure 100 through access openings formed in rear 108 and/or sides 104. The fiber 190 enters the cable management enclosure 100 and is passed over fiber slack manager 130. The fiber slack manager 130 may include clips to retain fiber 190 adjacent to the surface of the fiber slack manager 130. Fiber slack manager 130 manages the fiber cable slack and bend radius in a controlled, non-strenuous manner. From the fiber slack manager 130, the fiber is routed through one or more bend radius guides 150 that are positioned to form a loop of fiber while maintaining the fiber above a minimum bend radius. Suitable bend radius guides include a multi-level fiber manager or the BRG2 bend radius guide, both available from the Siemon Company of Watertown, Conn. The fiber is then lead to a splice tray 152 where an incoming fiber 190 can be spliced to an outgoing fiber (not shown). The outgoing fiber is then lead out the cable management enclosure 100 along bend radius guides 150 and fiber slack manager 130.

Figure 5:
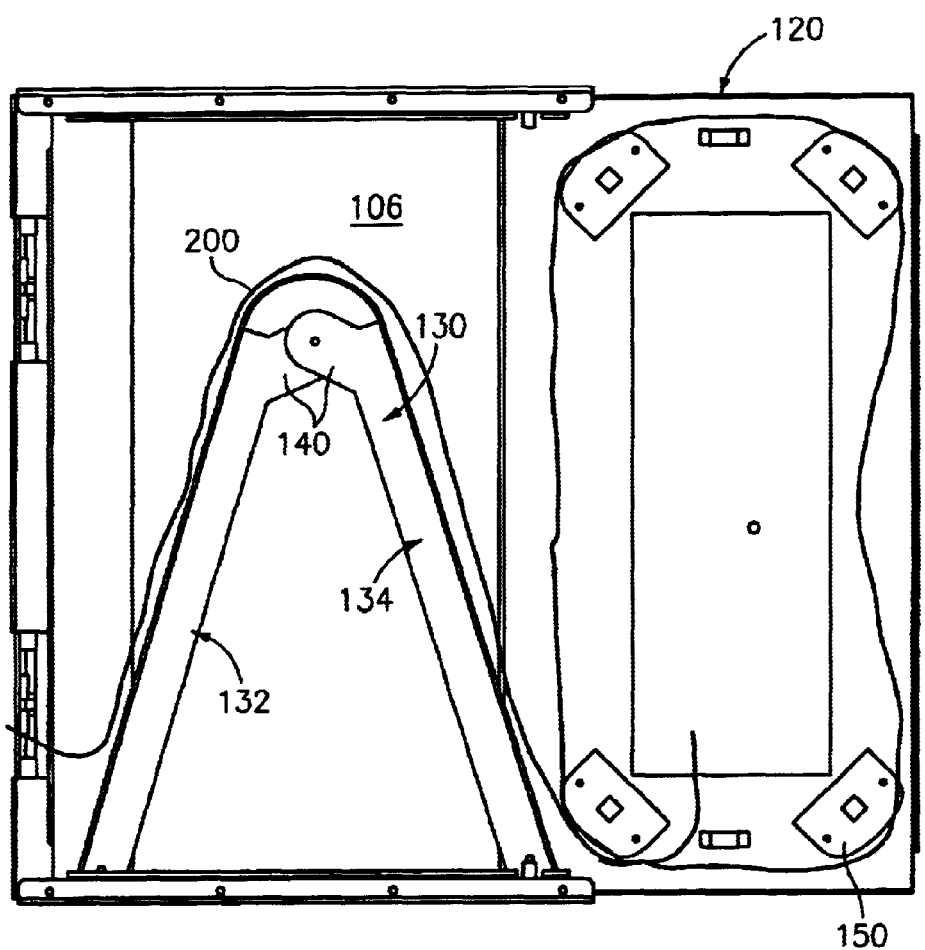
Figure 6:
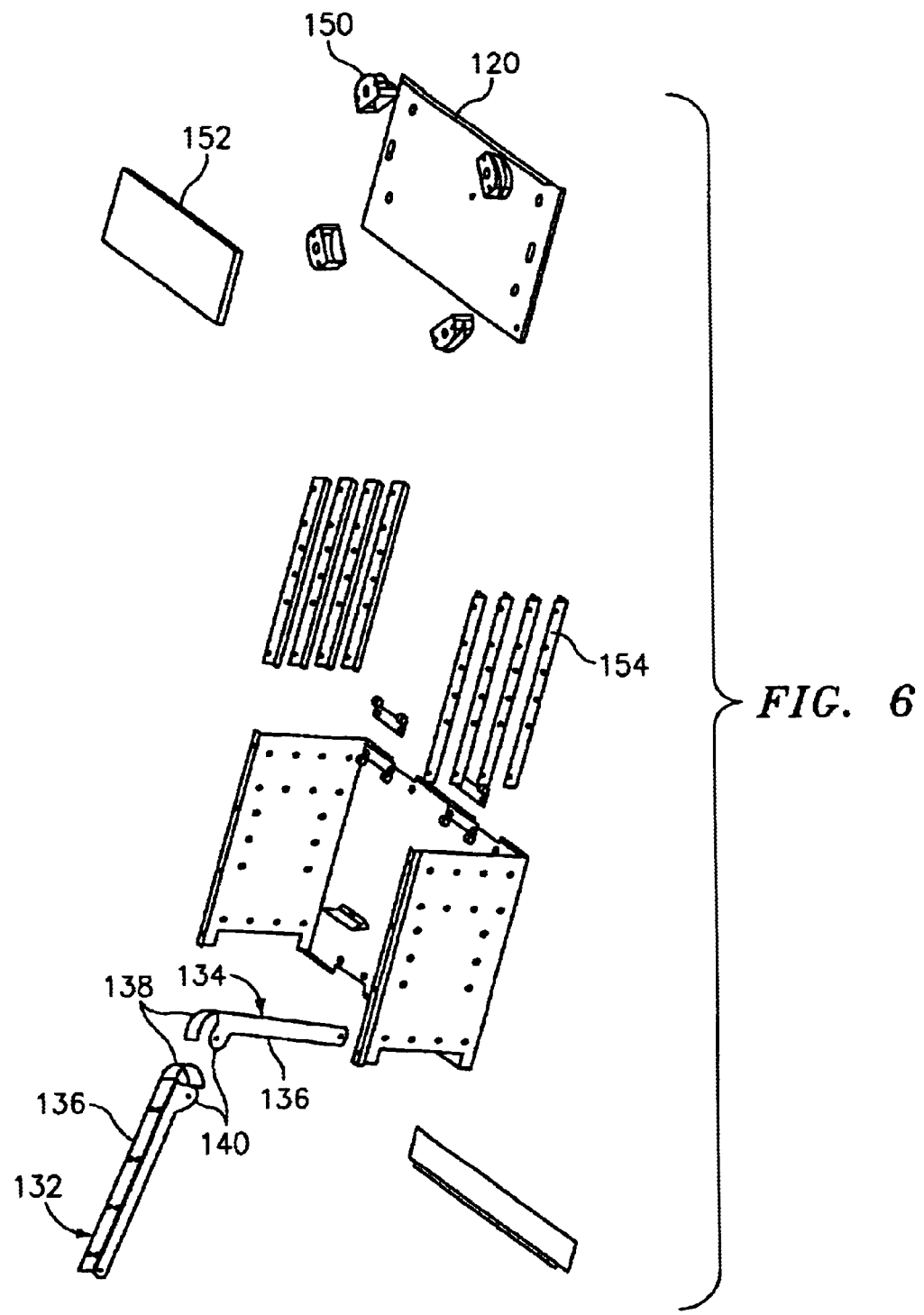
Figure 8:
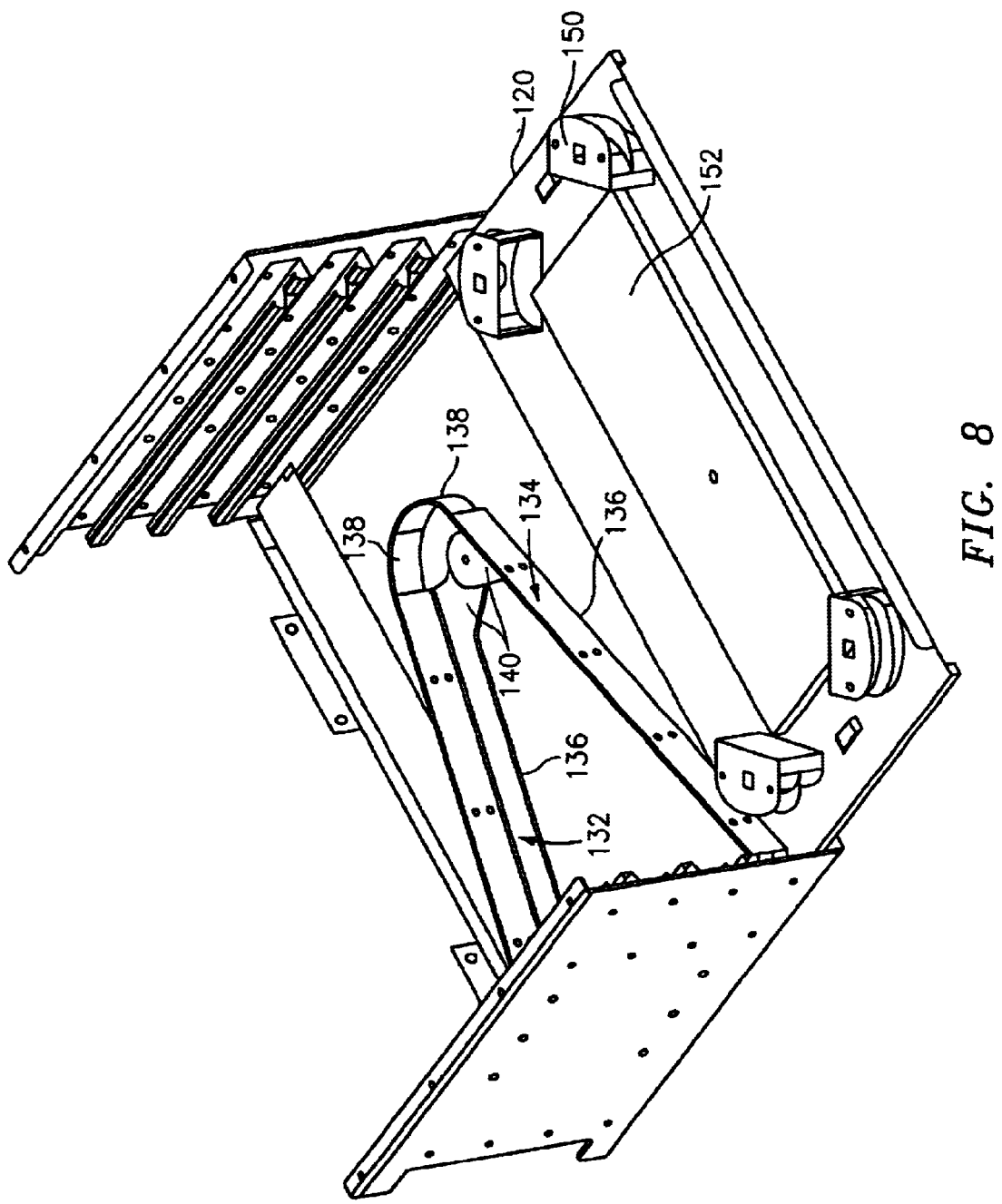

FIG. 5 depicts the sliding drawer 120 in the open position. As shown in FIG. 5, the fiber slack manager 130 expands to continuously accommodate the fiber 190. The fiber slack manager includes two links 132 and 134. As shown in FIGS. 5 and 6, each link includes a generally L-shaped arm section 136, an arc member 138 and a hinge plate 140. Links 132 and 134 may be formed from sheet metal. The outside surface of arm section 136 may include clips formed integrally with the arm section to retain fiber adjacent to the arm section. The clips may be formed by stamping L-shaped fingers in arm section 136. Alternatively, separate clips may be used and secured to arm sections 136. FIG. 8 is a perspective view of the cable management enclosure 100 showing the drawer 120 in the open position. The L-shaped nature of the arm sections 136 is shown in FIG. 8.

As shown in FIGS. 4 and 5, a distal end of link 132 is pivotally secured to the cable management enclosure 100, preferably at bottom 106. A distal end of link 134 is pivotally secured to sliding drawer 120. The two links 132 and 134 are pivotally coupled at hinge plates 140. The pivotal connections may be made using fasteners such as rivets.

As shown in FIG. 8, the arc members 138 are arcuate segments having radii selected so that the two arc members 138 are nestled together. In an exemplary embodiment, one arc member has a radius slightly larger than the radius of the other arc member. Also, one arc member may have a longer arc length than the other. The radii are selected to control the bend radius of the fiber 190 within acceptable limits. Hinge plates 140 extend from arm sections 136 and provide a surface for pivotally coupling the links 132 and 134.

Figure 7:
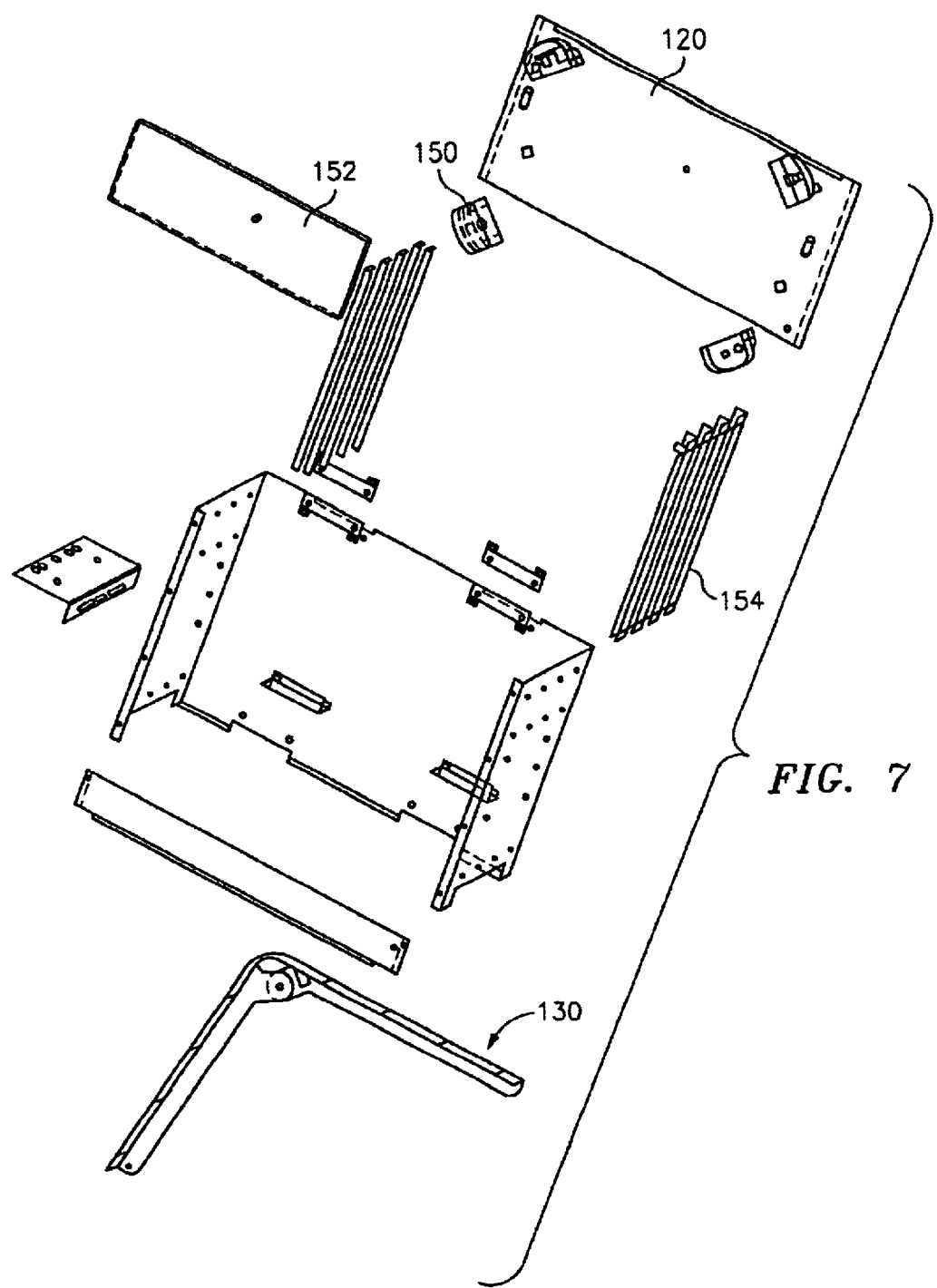

FIGS. 6 and 7 are exploded perspective views of the cable management enclosure 100. The cable management enclosure 100 includes drawer supports 154 on which the sliding drawers 120 rest. Any number of sliding drawers 120 may be used to accommodate a high number of fibers. In an exemplary embodiment of the invention, the cable management enclosure 100 includes twelve sliding drawers 120 with each drawer including a splice tray for twenty-four fibers. The cable management enclosure 100 has a reduced number of parts and the top, bottom, sides, drawer supports, sliding drawer and fiber slack manager can all be made from sheet metal thereby reducing the need for expensive molds.

Figure 9:
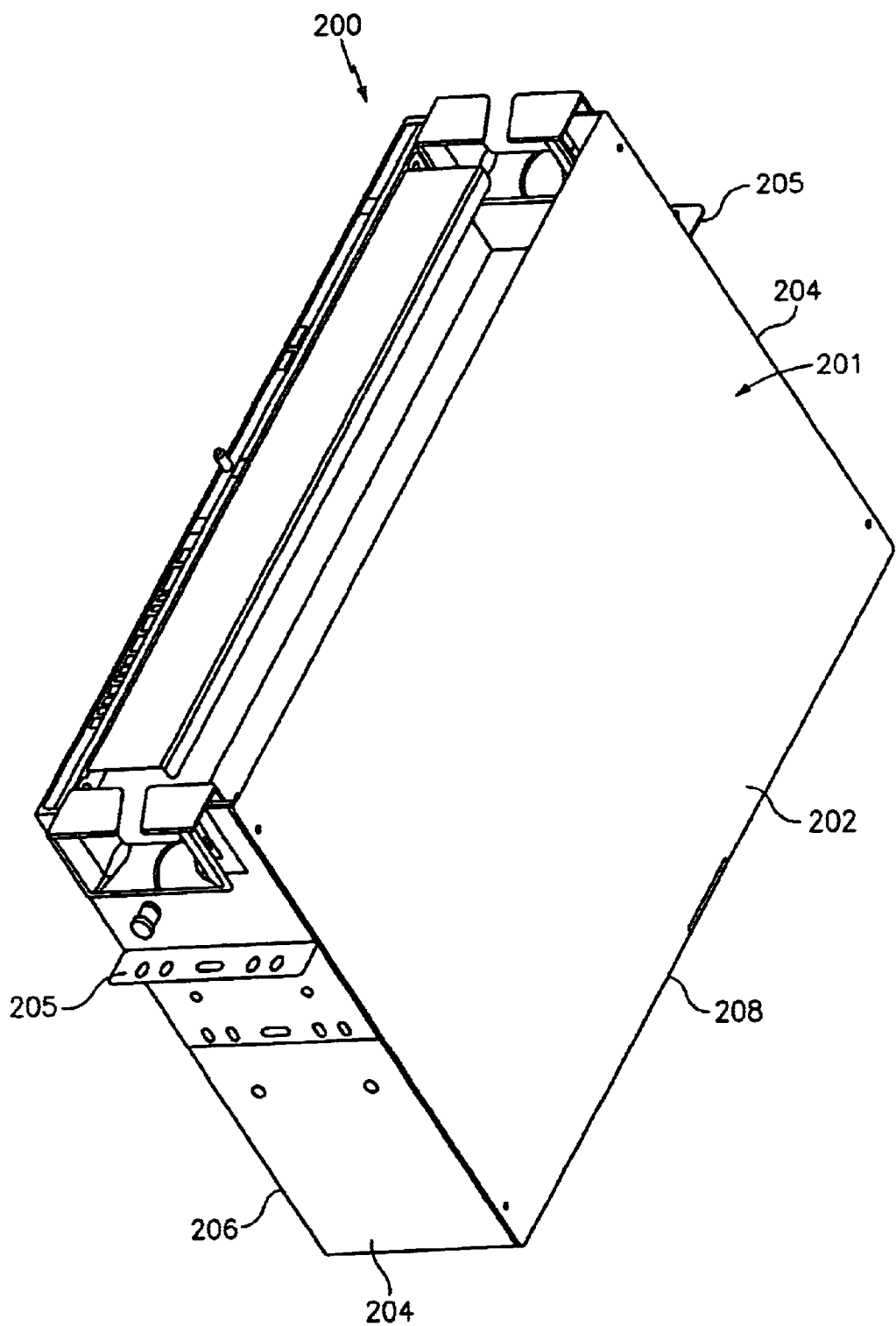
FIGS. 9–15 are various views of cable management enclosure that provides for fiber splicing and patching.
Figure 10:
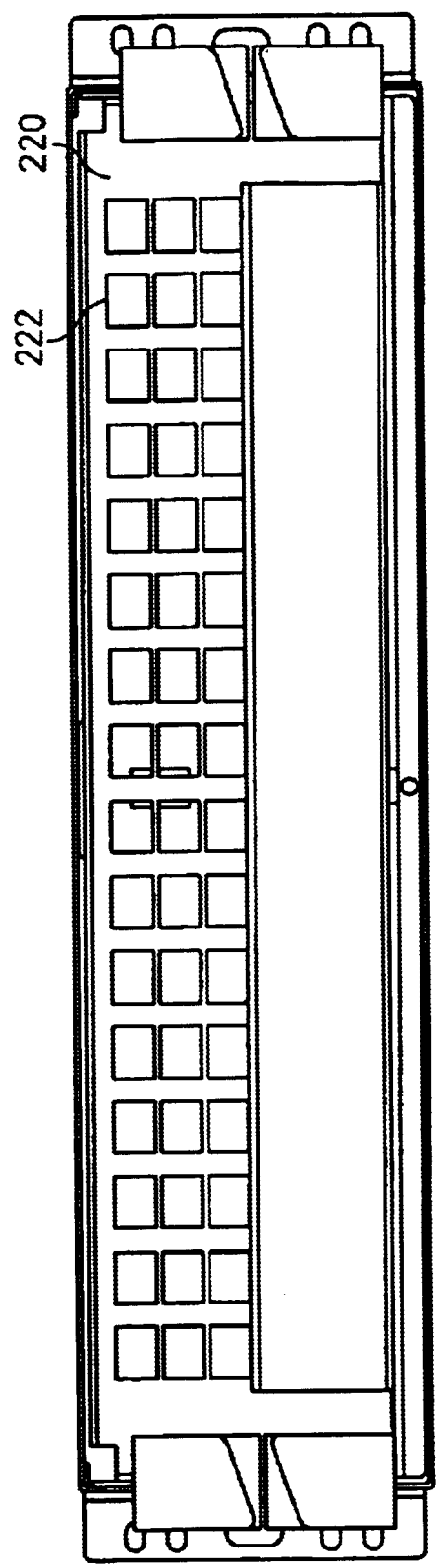
Figure 11:
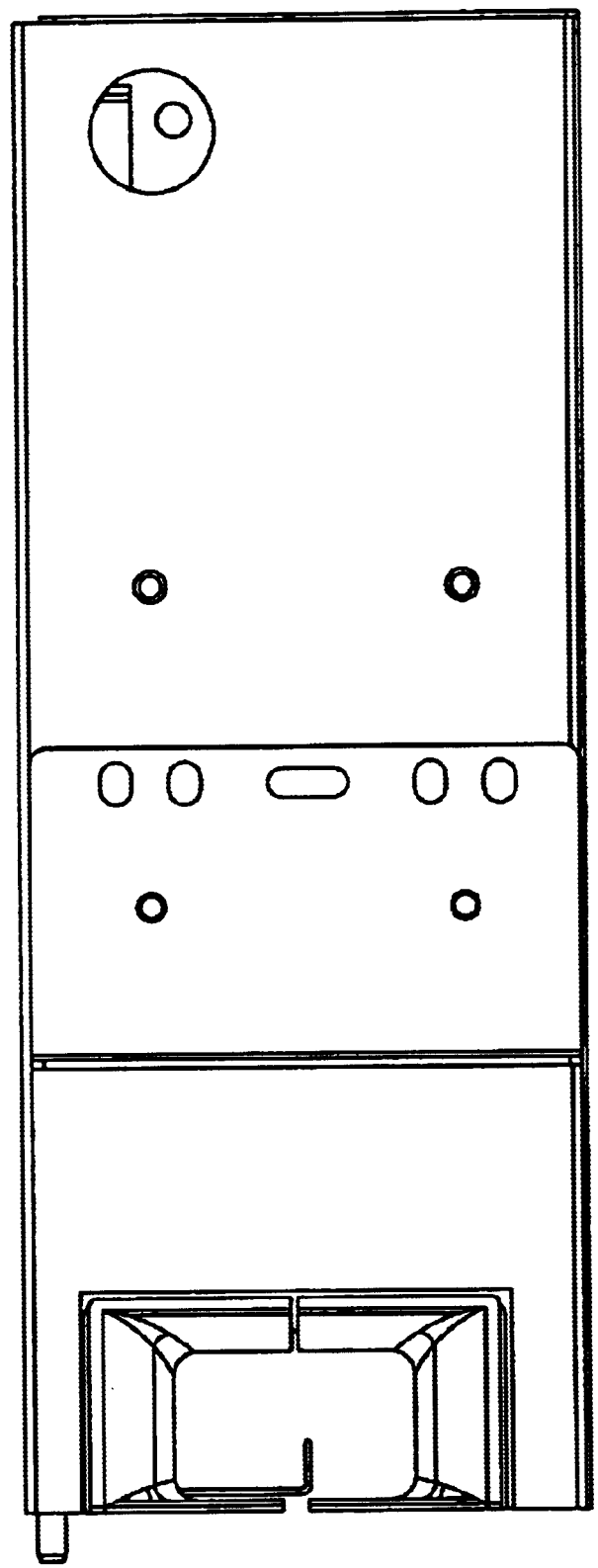

FIG. 9 is a perspective view of a cable management enclosure 200 in another embodiment of the invention. Cable management enclosure 200 provides for patching and splicing of fibers. The cable management enclosure 200 includes a main body portion 201 with five sides, including a top 202, sides 204, bottom 206 and rear 208. Cable management enclosure 200 may also include a front door to control access to the cable management enclosure 200. Rear 208 may be open and covered with a hinged door. The distance between sides 204 is set so that the cable management enclosure 200 can be mounted in standard telecommunications racks. Brackets 205 may be used to mount the cable management enclosure 200 to racks having various widths. FIG. 10 is a front view and FIG. 11 is a side view of the cable management enclosure 200. FIG. 10 depicts a patch panel 220 including a number of openings 222 for receiving fiber connectors. Openings 222 may receive the fiber connector housing or receive a bezel which in turn receives the fiber connector housing. In use, incoming fiber is terminated to a connector, which is then mounted in opening 222.

Figure 12:
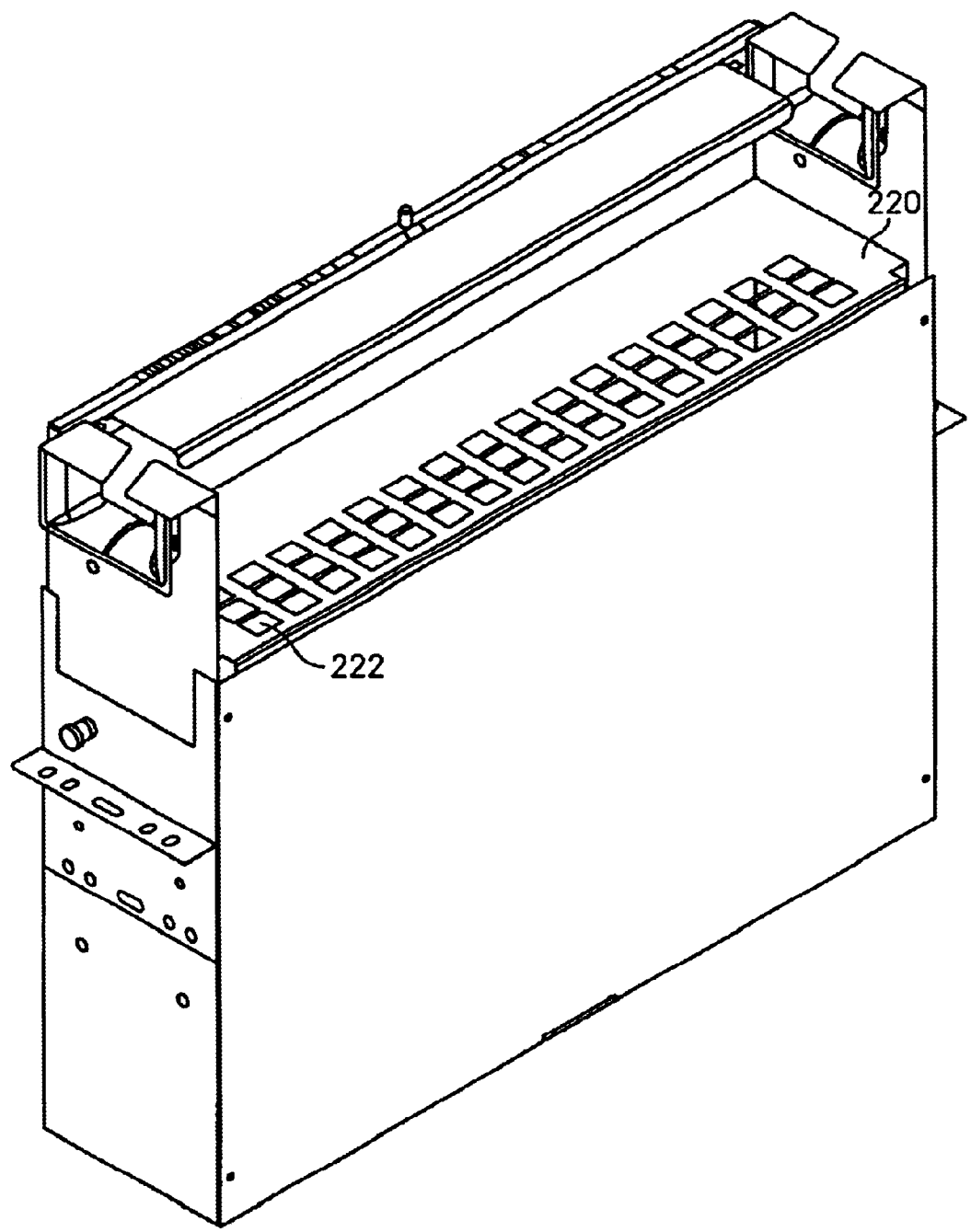
Figure 13:
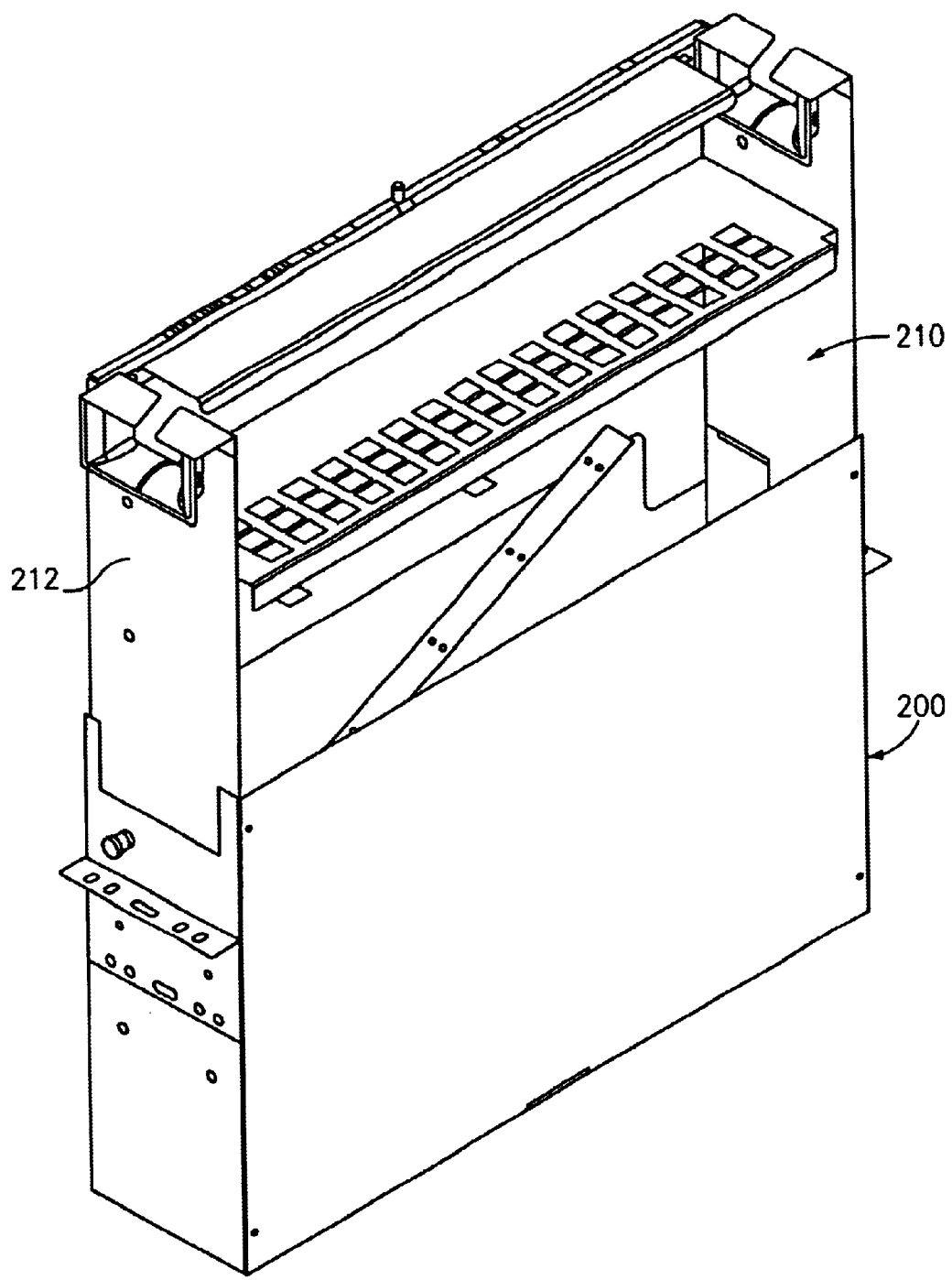
Figure 14:
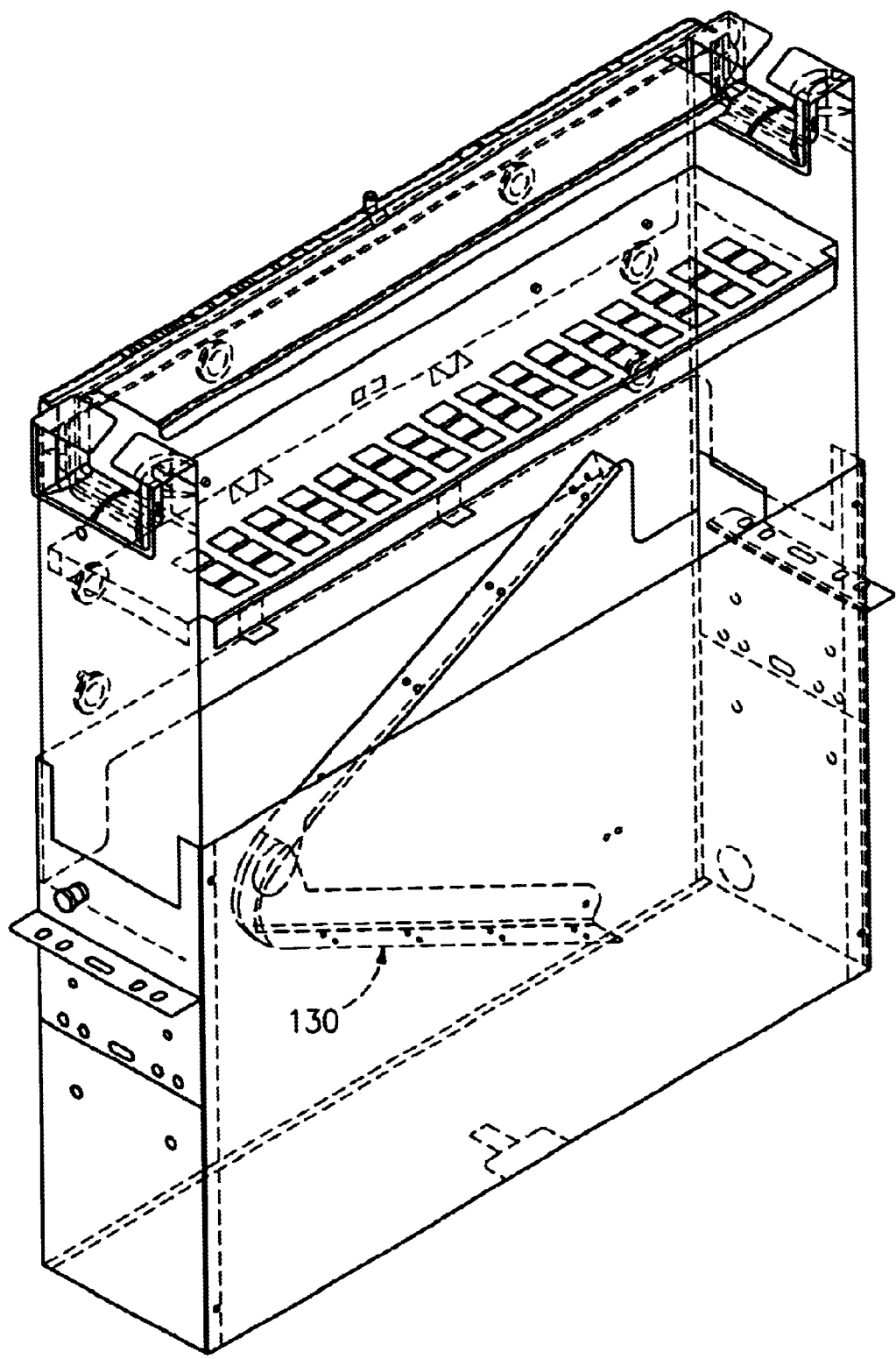

Referring to FIGS. 12–14, cable management enclosure 200 includes a sliding drawer 210 and a fiber slack manager 130, which is described above with reference to FIGS. 1–8. The patch panel 220 is mounted to the sliding drawer 210. FIG. 12 is a perspective view of cable management enclosure 200 with the sliding drawer closed. FIG. 13 is a perspective view of the cable management enclosure 200 with the sliding drawer open. As shown in FIG. 13, the sliding drawer 210 includes side walls 212. FIG. 14 is a perspective view of the cable management enclosure 200 with the sliding drawer 210 open depicting internal components.

Figure 15:
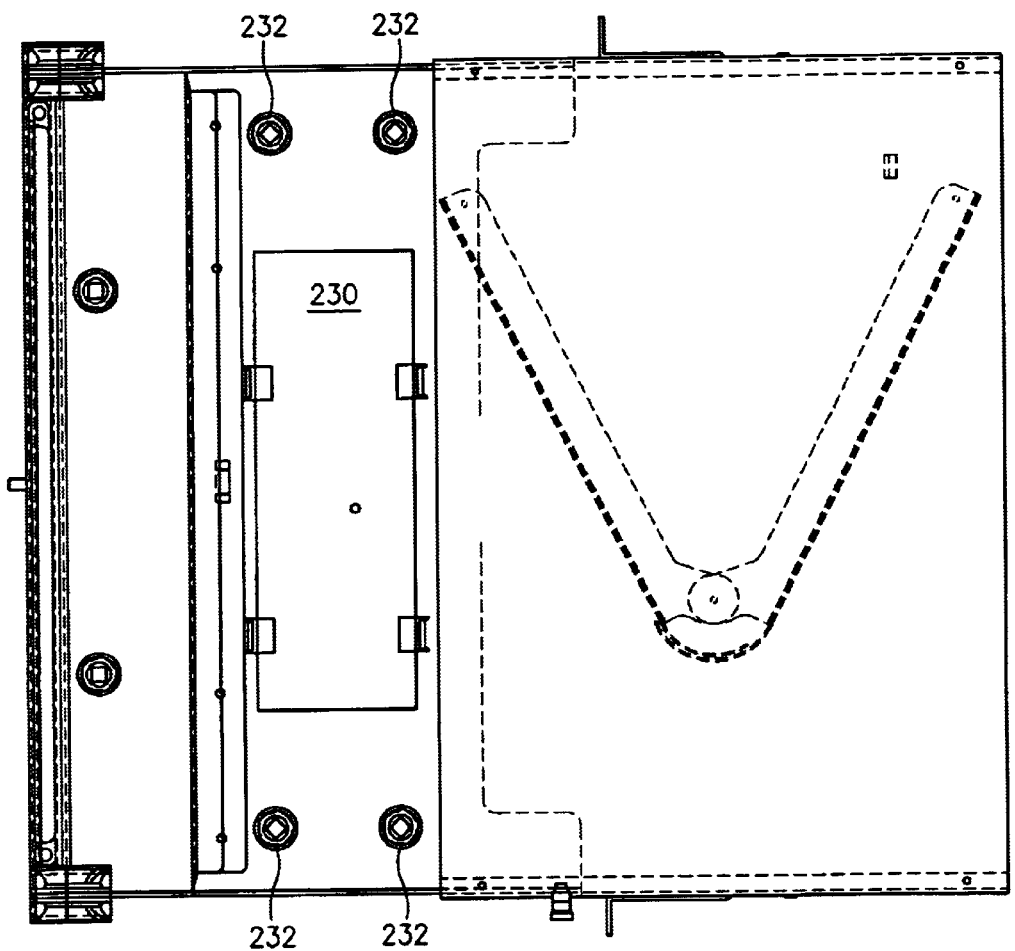

FIG. 15 is a top view of the cable management enclosure 200 with the sliding drawer 210 in the open position. Splice tray 230 is shown positioned on sliding drawer 210. Sliding drawer 210 may also include cable management devices at locations 232. Suitable cable management devices include a multi-level fiber manager or the BRG2 bend radius guide, both available from the Siemon Company of Watertown, Conn. The cable management enclosure 200 provides for both splicing of fiber through splice tray 230 and connectorizing fiber through patch panel 220.

Figure 16:
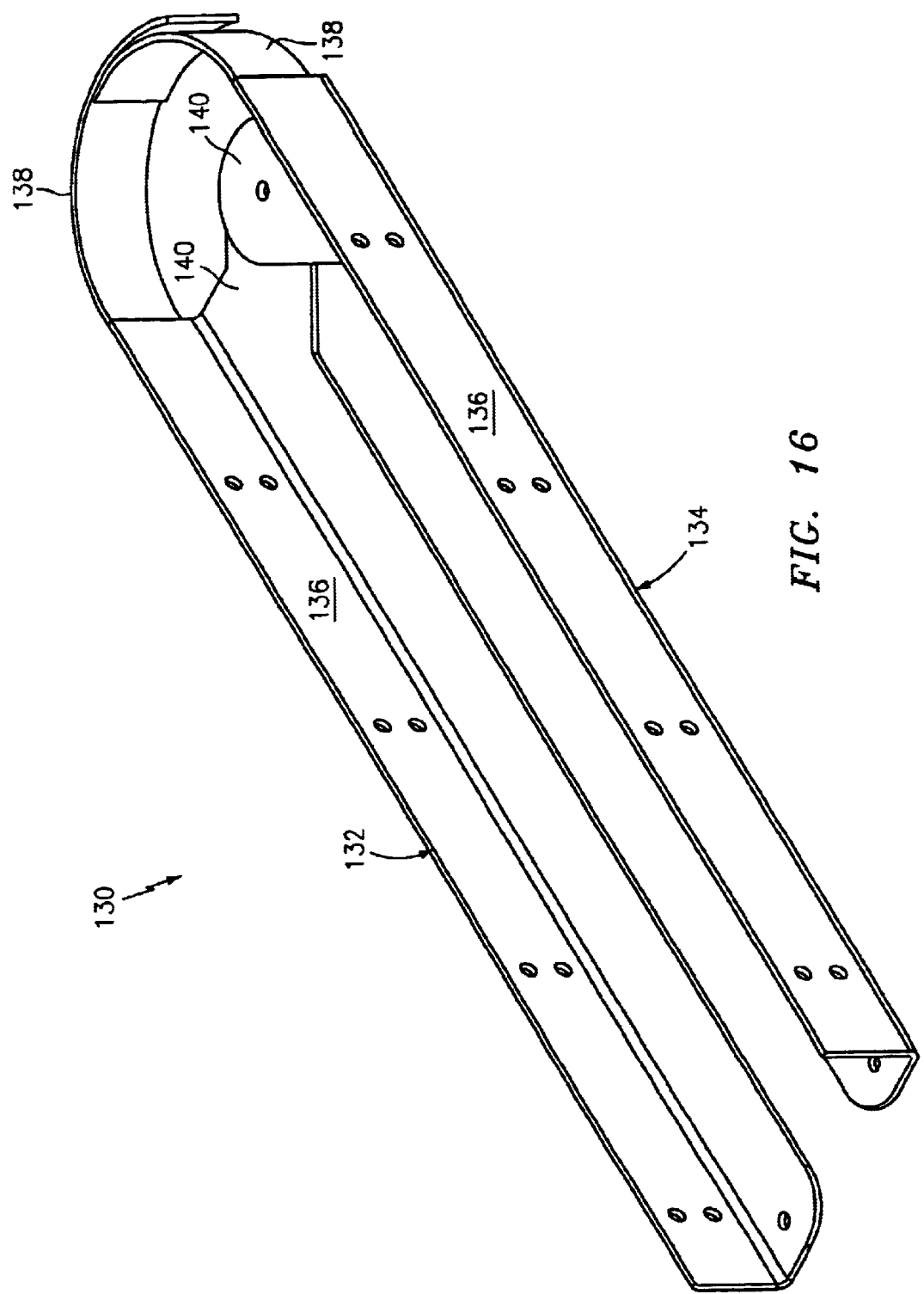
FIGS. 16–18 are various views of a fiber slack manager.
Figure 17:
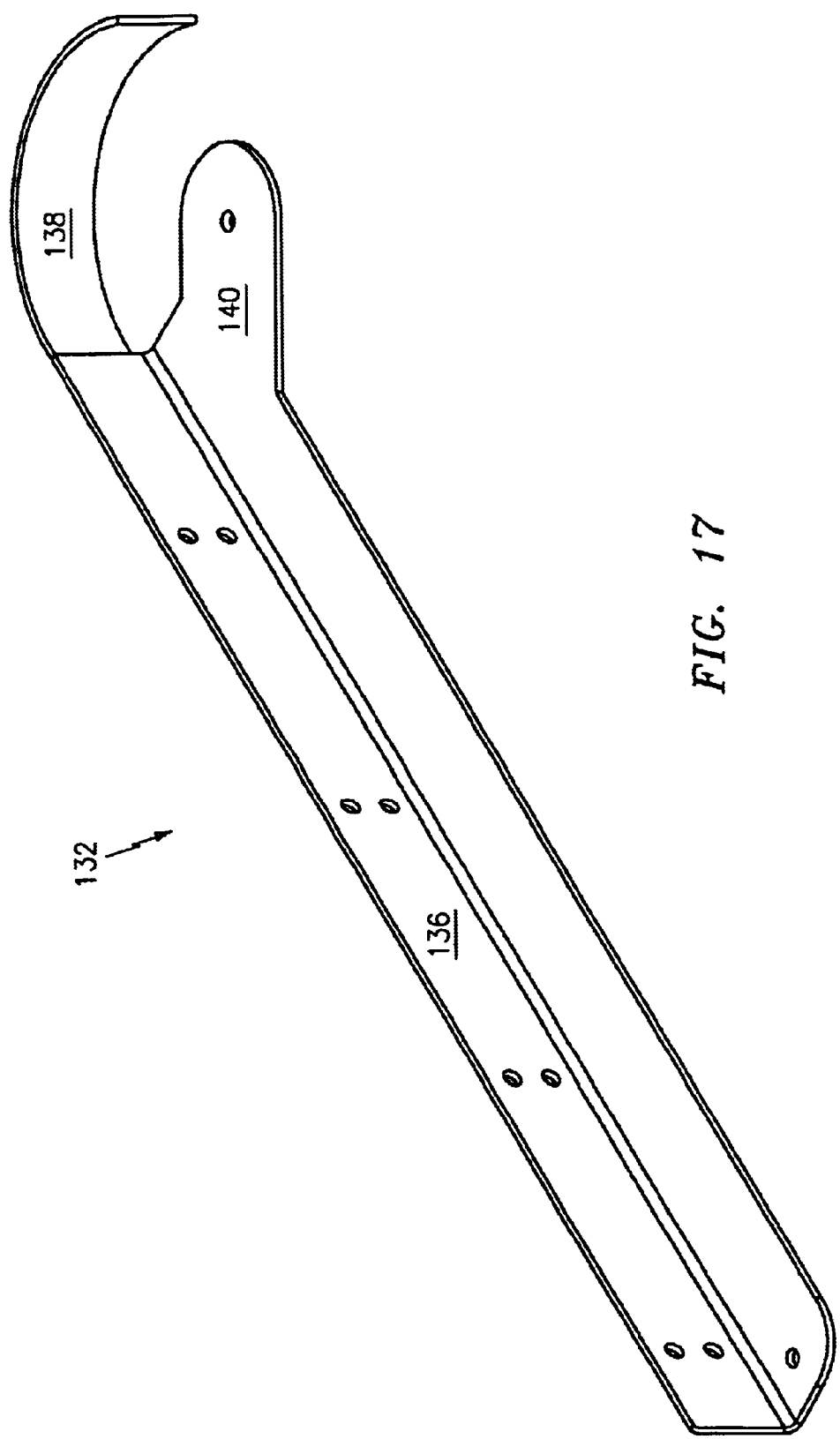
Figure 18:
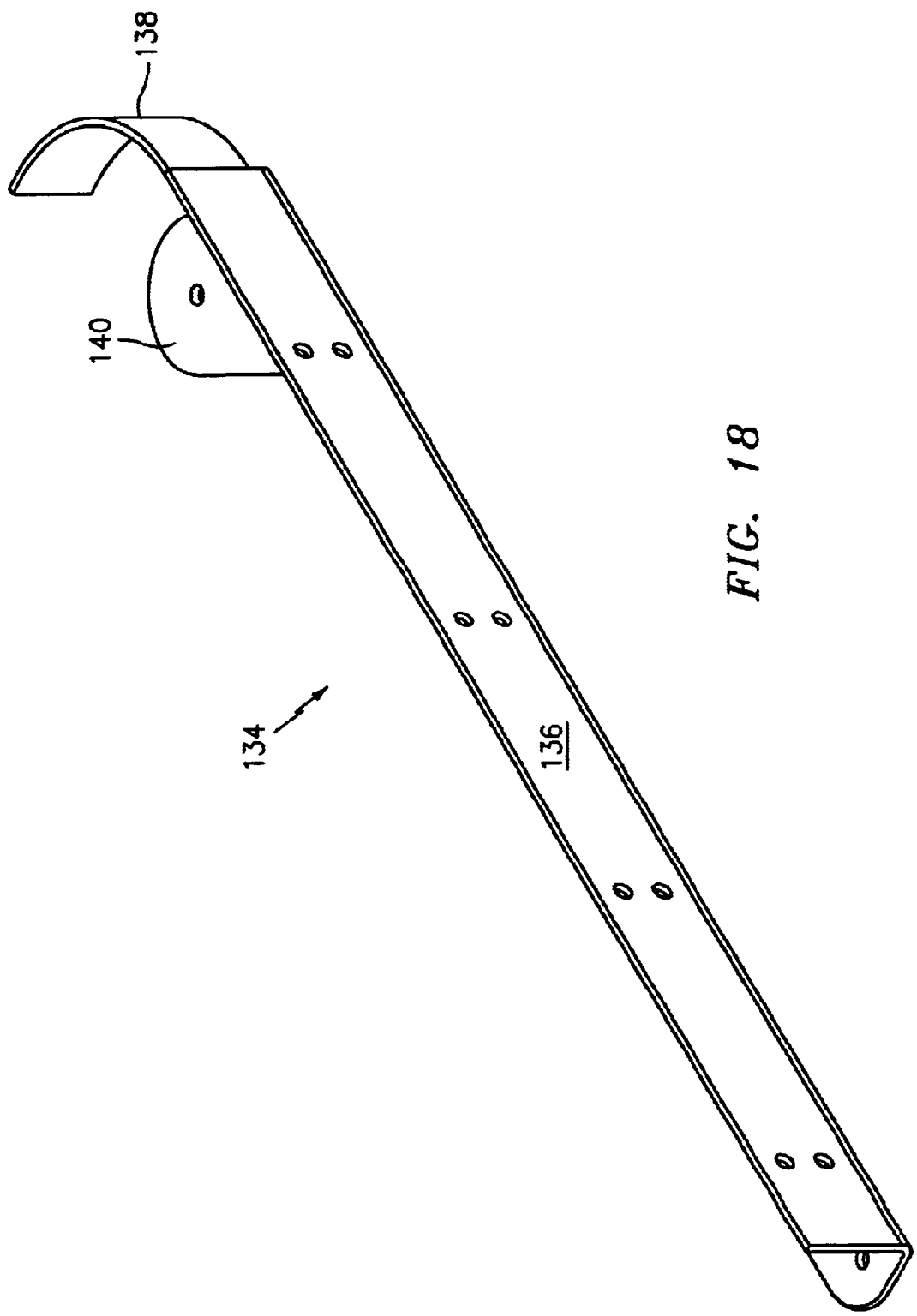

FIG. 16 is a perspective view of the fiber slack manager 130, FIG. 17 is a perspective view of the link 132 and FIG. 18 is a perspective view of the link 134. As shown in FIGS. 16–18, arm sections 136 arm generally L-shaped. The arc members 138 each have a proper radius and are length to interact as link 132 pivots relative to link 134 and control the bend radius of the fiber. In an exemplary embodiment, one arc member has a radius that is less than the radius of the other arc member.

Figure 19:
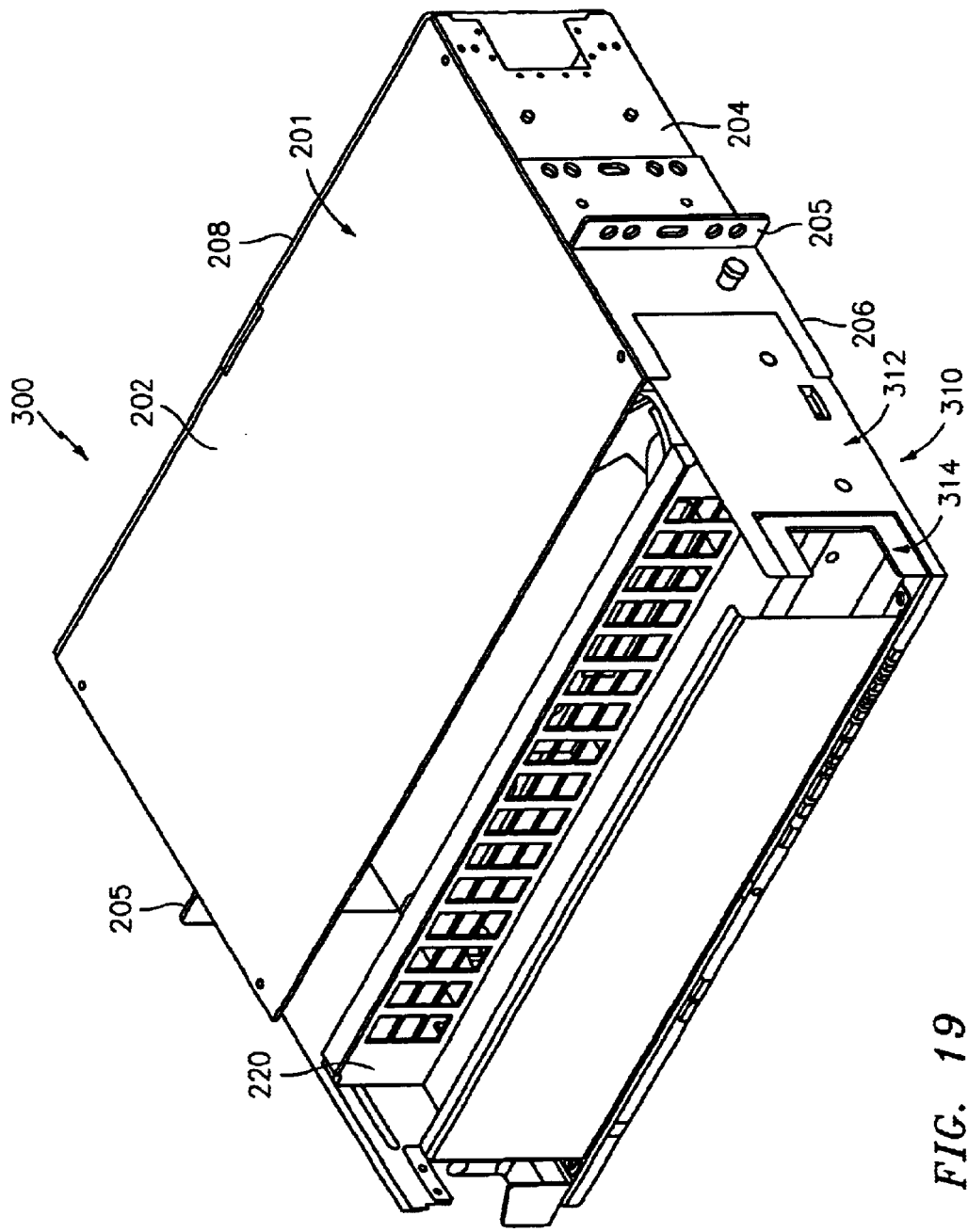
FIGS. 19–23 are various views of an alternate cable management enclosure having a telescoping drawer.

FIG. 19 is a perspective view of a cable management enclosure 300 in another embodiment of the invention. Cable management enclosure 300 is similar to that shown in FIGS. 9–15 and includes main body portion 201 with top 202, sides 204, bottom 206 and rear 208. In the embodiment shown in FIGS. 19–23, enclosure 300 has a sliding drawer 310 different than sliding drawer 210. Sliding drawer 310 is a telescoping drawer and includes a rear portion 312 and a front portion 314. The front portion 314 fits within the rear portion 312 and slides relative to the rear portion 312. The rear portion 312 also slides relative to the bottom 206, sides 204 and top 202. As shown in FIG. 19, the rear portion 312 of sliding drawer 310 is extended but front portion 314 is unextended. In this state, patch panel 220 is positioned close to top 202 thus providing a small access opening to the splice tray or rear of patch panel 220.

Figure 20:
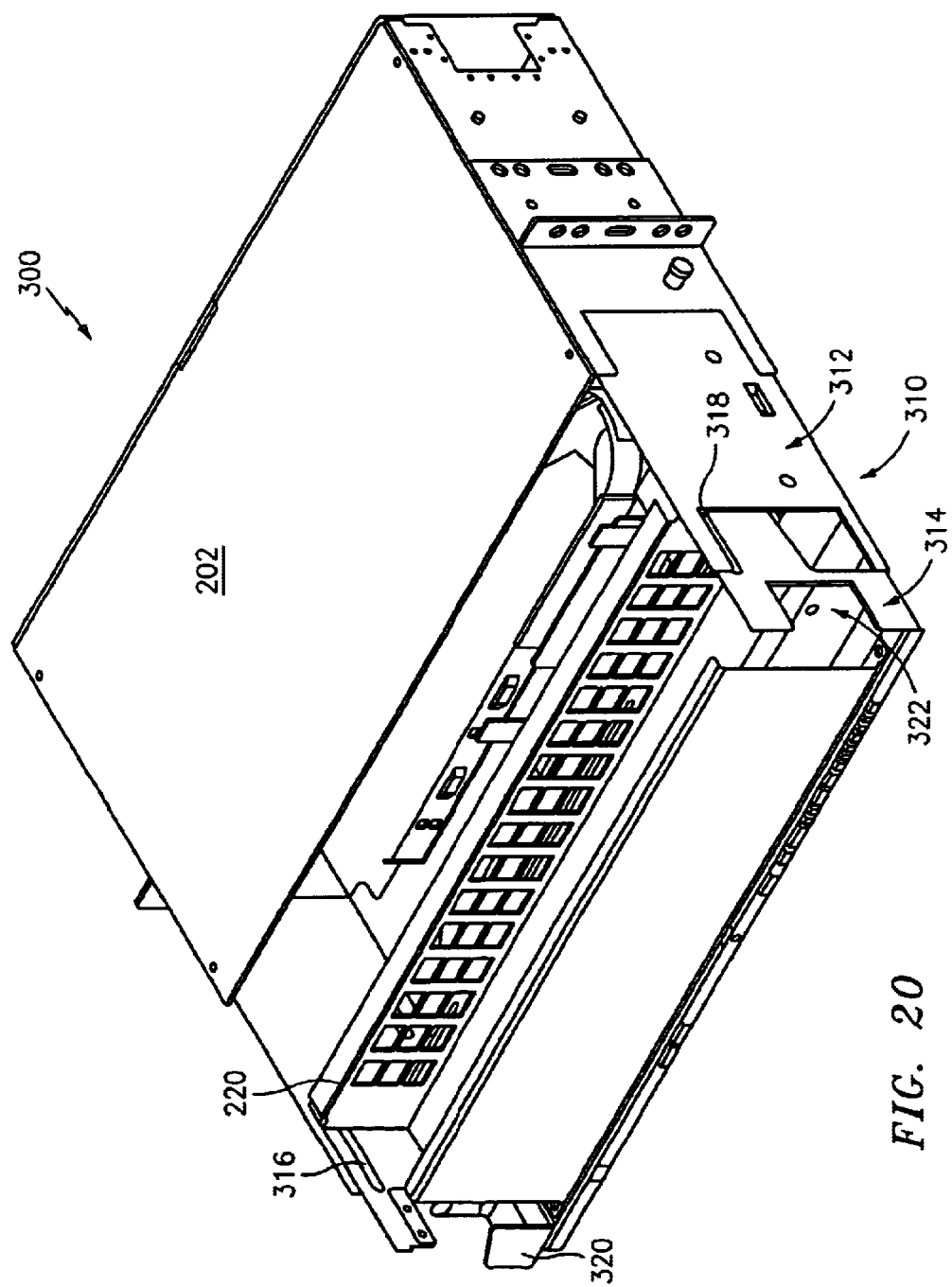

FIG. 20 shows the front portion 314 extended relative to the rear portion 312 of sliding drawer 310. The patch panel 220 is mounted to the front portion 314. Thus, when the front portion 314 is extended away from the rear portion 312, a larger access opening is provided between patch panel 220 and top 202. This facilitates access to the splice tray and rear of patch panel 220. A stop is used to limit the forward progress of the front portion 314. In one embodiment, a groove 316 in the front portion 314 receives a tab 318 formed on the rear portion 312. When the tab 318 reaches the end of groove 316, travel of the front portion 314 is stopped. Conversely, when the front portion 314 is moved towards the rear portion 312, the tab 318 contacts the front of groove 316 thereby applying force to the rear portion 312 to close the sliding drawer 310.

The patch panel 220 moves with the front portion 314 to preserve bend radius control of fiber optic cable at the front of the patch panel 220. A fiber protector 320 may be mounted in cut outs 322 where fiber optic cable is routed from the front of the enclosure. These outlet areas are formed on the front portion 314 of sliding tray 310 and thus move along with patch panel 220. Thus, a constant bend radius of the fiber optic cable is maintained even when the sliding drawer 310 is fully extended.

Figure 21:
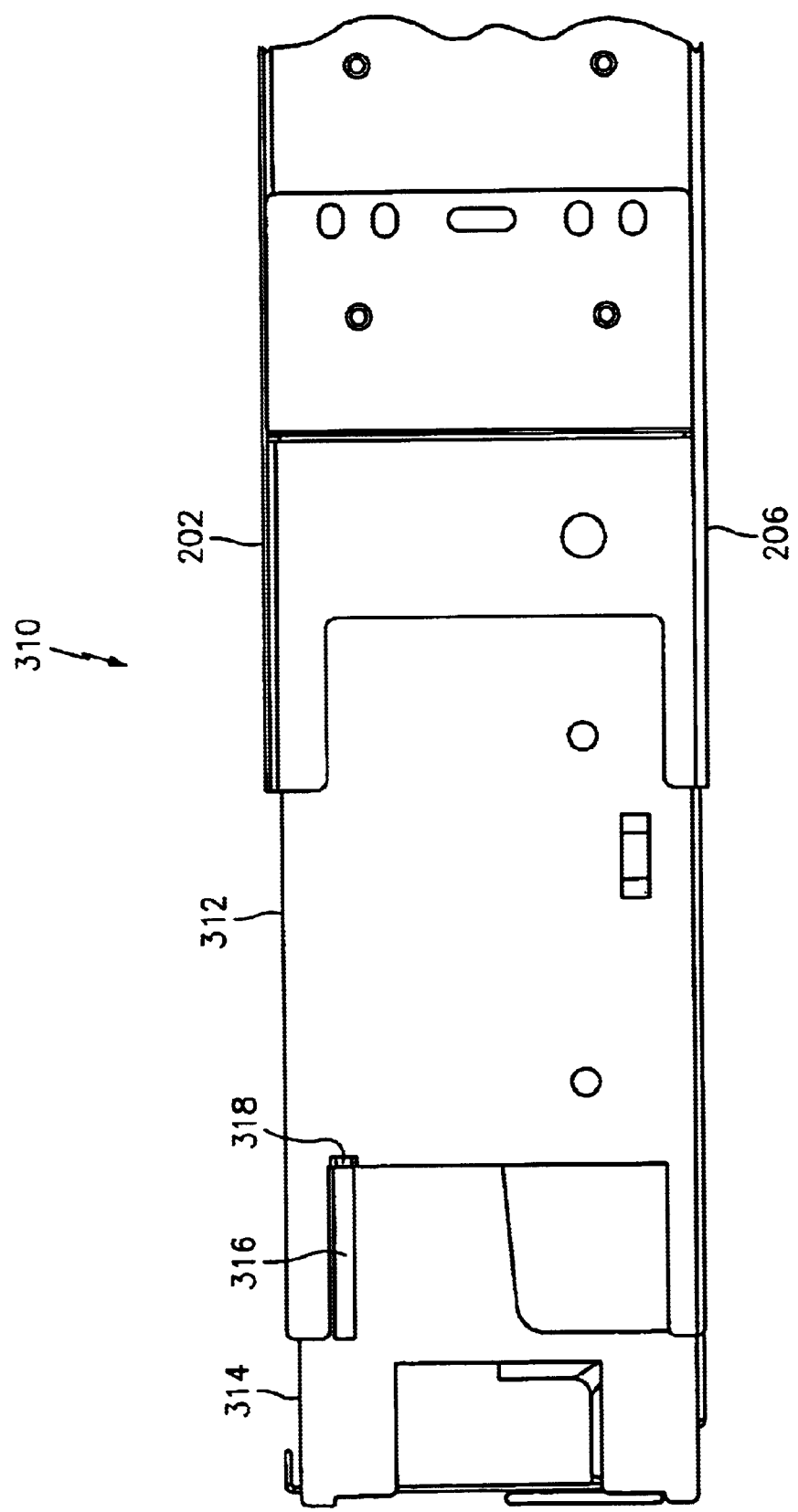
Figure 22:
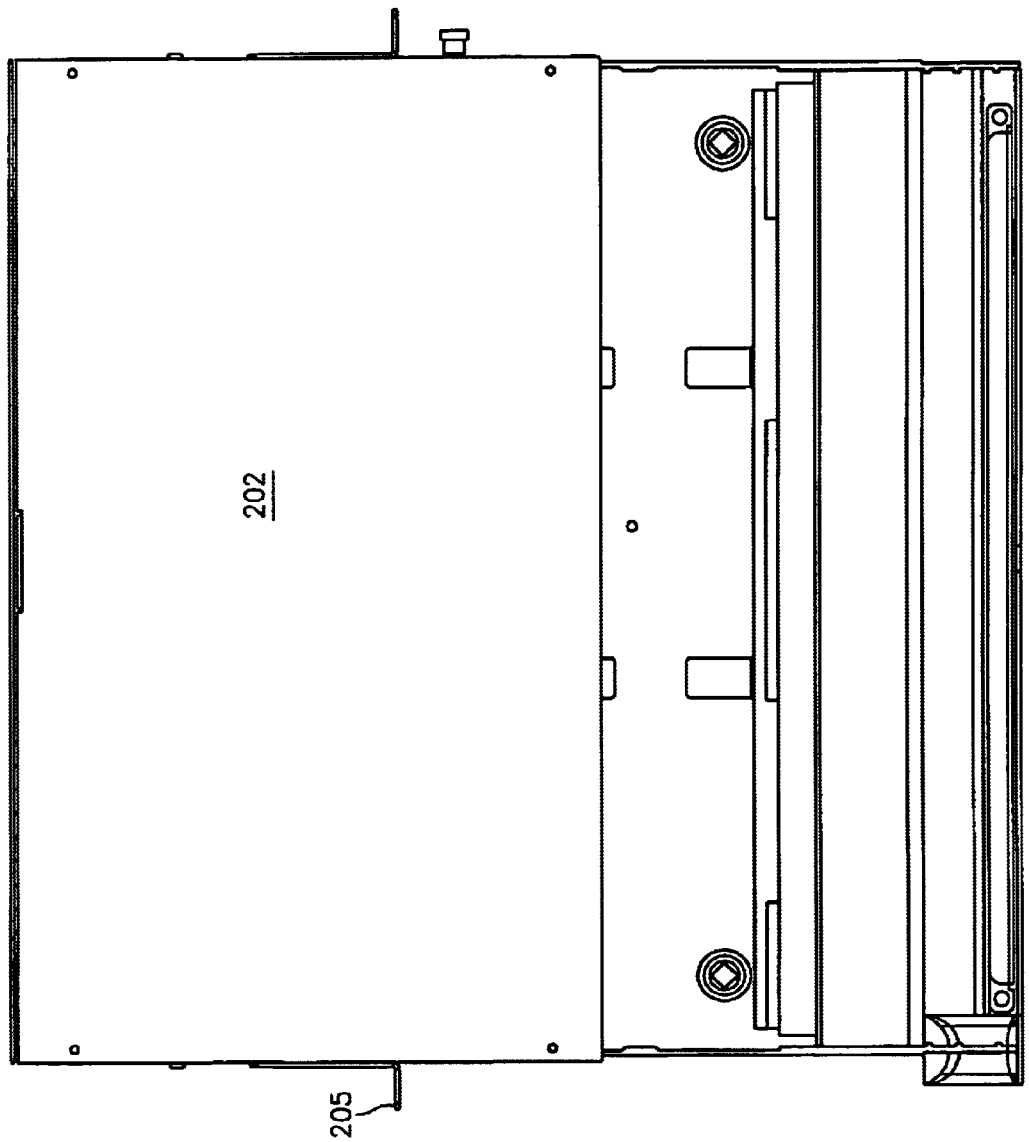
Figure 23:
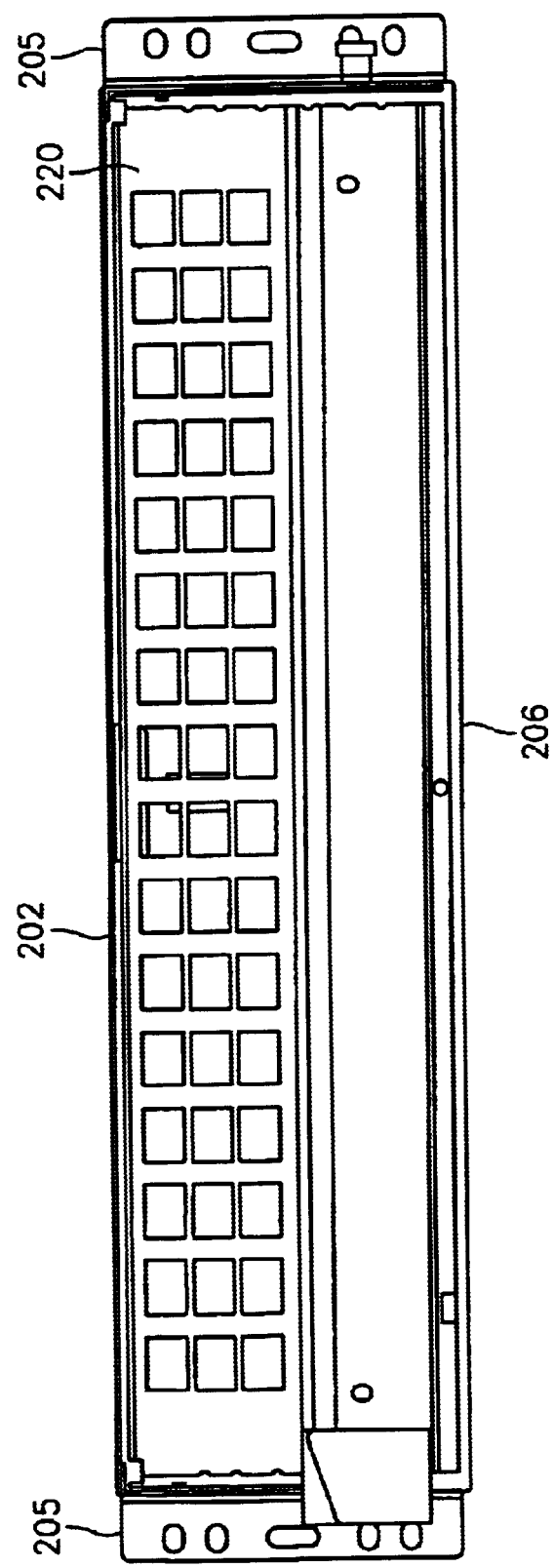

FIG. 21 illustrates a side view of the sliding drawer 310 of the cable management enclosure 300. FIG. 22 illustrates a top view of the cable management enclosure 300. FIG. 23 illustrates a front view of the cable management enclosure. Each view further illustrates the cable management enclosure 300, as described above.

Figure 24:
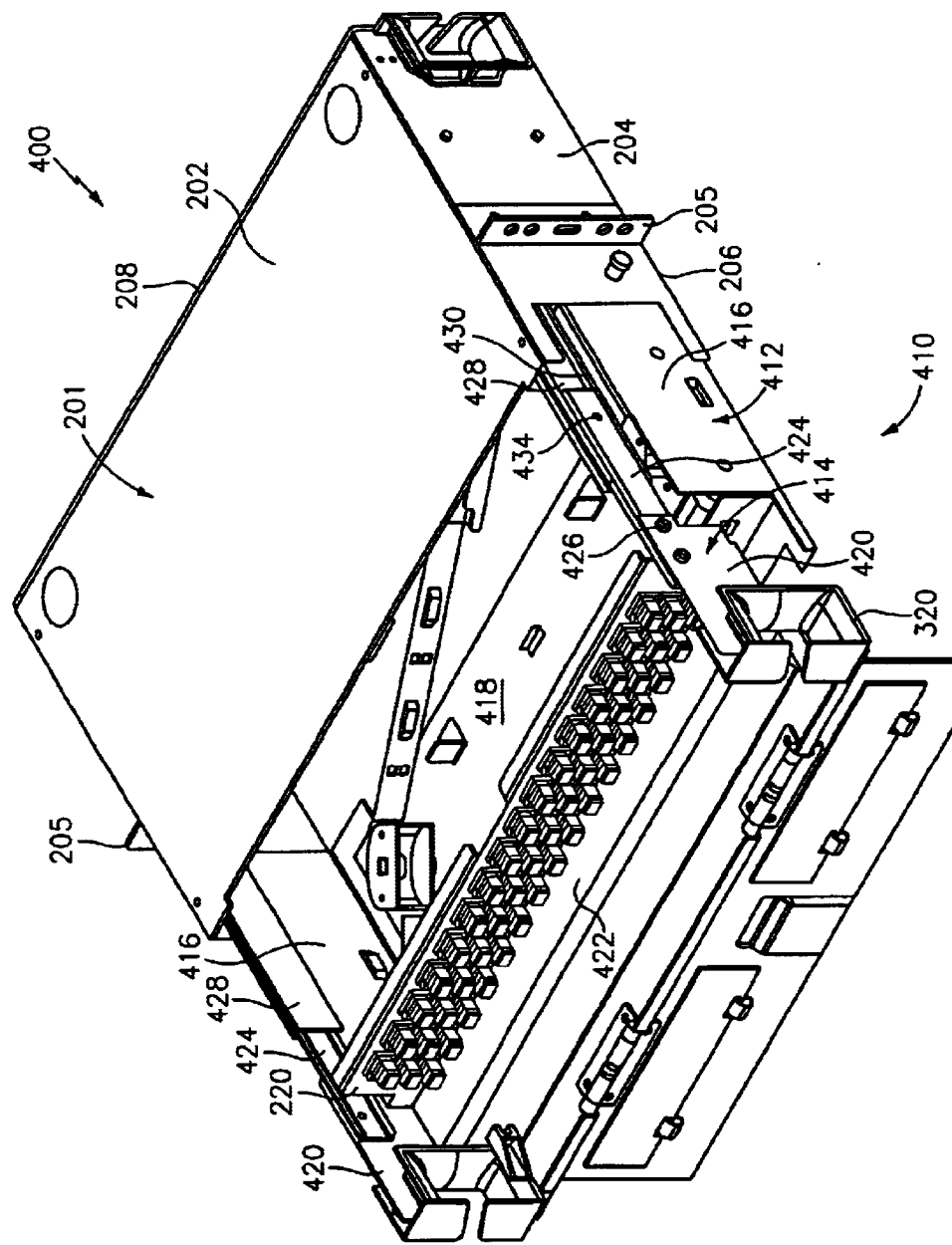
FIG. 24 is a perspective view of an alternate cable management enclosure having an alternative sliding drawer arrangement.

FIG. 24 is a perspective view of a cable management enclosure 400 in another embodiment of the invention. Cable management enclosure 400 is similar to that shown in FIGS. 9–15 and FIGS. 19–23 and includes main body portion 201 with top 202, sides 204, bottom 206, rear 208, and brackets 205. In the embodiment shown in FIG. 24, enclosure 400 has a sliding drawer 410 different than sliding drawer 210 and sliding drawer 310. Sliding drawer 410 includes a rear portion 412 and a front portion 414. The rear portion 412 includes two sides 416 and a base 418. The front portion 414 also includes two sides 420 and a base 422. Two sides 416 and base 418 may be formed from a folded piece of sheet metal. Two sides 420 and base 422 may also be formed from a folded piece of sheet metal. Sides 420 are coupled to a slide portion 424 by fastening means 426 such as a bolt, screw, or the like. Brackets 428 are mounted to top sides 430 of sides 416. The front portion 414 is slideably mounted to the rear portion 412, by having brackets 428 receive slide portion 424. Sides 420 are shaped to fit and couple with fiber protector 320.

The rear portion 412 slides relative to the bottom 206, sides 204 and top 202. The front portion 414 also slides independently from rear portion 412 and relative to the bottom 206, sides 204 and top 202. FIG. 24 shows the front portion 414 extended relative to the rear portion 412 of sliding drawer 410. When sliding drawer is closed, front portion 414 slides closer to rear portion 412 until front portion 414 cannot slide any further. Rear portion 412 then slides into main body portion 201.

The patch panel 220 is mounted to the front portion 414. Thus, when the front portion 414 is extended away from the rear portion 412, a larger access opening is provided between patch panel 220 and top 202. This facilitates access to the splice tray and rear of patch panel 220. A stop may be used to limit the forward progress of the front portion 414. The stop includes a projection 434 that is located at the sliding portion 424 and faces the bracket 428. The projection can be a bolt, or similar like structure, that passes through sliding portion. The projection 434 comes in contact with a ledge (not shown) located in bracket 428, which stops the forward progress of front portion 414.

The patch panel 220 moves with the front portion 414 and allows the fiber optic cable to move also, which preserves the bend radius control of the fiber optic cable at the front of the patch panel 220. Thus, a constant bend radius of the fiber optic cable is maintained even when the sliding drawer 410 is fully extended.

While the invention has been described with reference to exemplary embodiments, it will be understood by those skilled in the art that various changes may be made and equivalents may be substituted for elements thereof without departing from the scope of the invention. In addition, many modifications maybe made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A cable management enclosure comprising:
   a side;
   a sliding drawer;
   a fiber slack manager mounted to said side, said fiber slack manager includes:
      a first link having a first end and a second end, said first end pivotally secured to said side; and
      a second link pivotally coupled to said second end of said first link,
      said second link pivotally secured to said sliding drawer;
   wherein said first link is a first arm section having a first arc member disposed at said second end and a first hinge plate disposed at said second end and disposed proximate said first arc member.

2. The enclosure of claim 1, further comprising a bend radius guide mounted to said sliding drawer and disposed proximate to said first link.

3. The enclosure of claim 2, wherein said bend radius guide includes a plurality of bend radius guides, each bend radius guide disposed proximate to a corner of said sliding drawer.

4. The enclosure of claim 1, further comprising a clip disposed at said first link.

5. The enclosure of claim 4, wherein said clip is formed as part of said first link.

6. The enclosure of claim 4, wherein said clip is mounted to said first link.

7. The enclosure of claim 1, wherein said first arm section, said first arc member and said first hinge plate are formed from sheet metal.

8. The enclosure of claim 1, wherein said second link is a second arm section having a second arc member disposed at said second end and a second hinge plate disposed proximate said second arc member.

9. The enclosure of claim 8, wherein said first link is pivotally coupled to said second link at said first hinge plate and said second hinge plate.

10. The enclosure of claim 8, wherein said first arc member and said second arc member have a selected radii so that said first arc member is nested with said second arc member.

11. The enclosure of claim 8, wherein said first arc member has a first radius and said second arc member has a second radius.

12. The enclosure of claim 11, wherein said first radius and said second radius are selected to control a bend radius of a fiber optic cable.

* * * * *